United States Patent
Lee et al.

(10) Patent No.: US 12,400,727 B2
(45) Date of Patent: Aug. 26, 2025

(54) CALCULATION ERROR CORRECTION DEVICE AND METHOD APPLIED TO RESISTIVE MEMORY-BASED NEURAL NETWORK ACCELERATOR

(71) Applicant: UNIST(ULSAN NATIONAL INSTITUTE OF SCIENCE AND TECHNOLOGY), Ulsan (KR)

(72) Inventors: Jongeun Lee, Ulsan (KR); Sugil Lee, Ulsan (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 848 days.

(21) Appl. No.: 17/636,895

(22) PCT Filed: Aug. 4, 2021

(86) PCT No.: PCT/KR2021/010281
§ 371 (c)(1),
(2) Date: Feb. 21, 2022

(87) PCT Pub. No.: WO2023/013797
PCT Pub. Date: Feb. 9, 2023

(65) Prior Publication Data
US 2023/0352113 A1 Nov. 2, 2023

(51) Int. Cl.
*G11C 29/52* (2006.01)
*G06F 17/16* (2006.01)
*G06N 3/04* (2023.01)

(52) U.S. Cl.
CPC .............. *G11C 29/52* (2013.01); *G06F 17/16* (2013.01); *G06N 3/04* (2013.01)

(58) Field of Classification Search
CPC ............ G11C 29/52; G06F 17/16; G06N 3/04
(Continued)

(56) References Cited

U.S. PATENT DOCUMENTS 11,431,347 B2 * 8/2022 Danial .................. G06N 3/065
2019/0180185 A1 * 6/2019 Sun ....................... G06V 10/82
(Continued)

FOREIGN PATENT DOCUMENTS

KR 10-2018-0042645 A 4/2018

OTHER PUBLICATIONS

TxSim: Modeling Training of Deep Neural Networks on Resistive Crossbar Systems, Roy et al, Jan. 8, 2021 (Year: 2021).*

*Primary Examiner* — Austin Hicks
(74) *Attorney, Agent, or Firm* — Revolution IP, PLLC

(57) ABSTRACT

The present disclosure provides a calculation error correction device including a first learning unit that trains an effective weight value prediction model for outputting an effective weight value matrix by using learning data in response to an input of the random weight value matrix, an effective weight value calculation unit that inputs a first weight value matrix into the effective weight value prediction model to derive the effective weight value matrix, a second learning unit that applies a second input vector to a target neural network as an input value, applied the effective weight value matrix as a weight value, and trains the weight value such that an output vector follows a result of multiplication of the second input vector and the first weight value matrix, and a control unit that performs matrix-vector multiplication by mapping the first input vector and the trained weight value matrix to the resistive memory.

6 Claims, 5 Drawing Sheets

(58) Field of Classification Search
USPC .......................................................... 706/15
See application file for complete search history.

(56) References Cited

U.S. PATENT DOCUMENTS

| | | | |
|---|---|---|---|
| 2020/0184333 A1* | 6/2020 | Oh ........................ | G06N 3/045 |
| 2021/0326687 A1* | 10/2021 | Liu ........................ | G06N 3/065 |
| 2021/0366501 A1* | 11/2021 | Lee ........................ | G06N 3/045 |
| 2022/0066888 A1* | 3/2022 | Chakrabarty .......... | G06N 20/10 |

* cited by examiner (a) MNIST (b) CIFAR10 (128 × 128)

(c) SVHN (128 × 128)

CALCULATION ERROR CORRECTION DEVICE AND METHOD APPLIED TO RESISTIVE MEMORY-BASED NEURAL NETWORK ACCELERATOR

TECHNICAL FIELD

The present disclosure relates to calculation error correction device and method applied to a resistive memory-based neural network accelerator, and more particularly, to calculation error correction device and method for a neural network accelerator that may increase estimation performance of the neural network accelerator by correcting distortion resulting from matrix multiplication due to wire resistance of a resistive memory.

BACKGROUND ART

A core operation that occupies most of a neural network calculation is matrix-vector multiplication. In this regard, a ReRAM crossbar array (RCA) may implement matrix-vector multiplication quickly and efficiently and is used as hardware for a neural network accelerator.

Such a resistive memory array has a structure in which resistive elements are arranged in a two-dimensional lattice form. Here, when values of a matrix to be multiplied are mapped to conductance values (reciprocal of resistance) of respective resistive elements and a value of a vector to be multiplied is applied as a voltage, a result of matrix multiplication is derived in the form of a current value according to an equation of I=V/R.

However, a memory array has a problem of a voltage drop (IR drop) in which a voltage applied to each device is lower than the expected value due to influence of wire resistance and so on, and due to this, a measured current is also lower than a desired value, resulting in distortion in a result of matrix multiplication. Furthermore, the distorted calculation result is a factor that reduces estimation performance of a neural network.

Accordingly, there is a need for a system capable of increasing estimation accuracy of a neural network by rapidly predicting influence of a voltage drop on a resistive memory array.

The technology that is a background of the present disclosure is disclosed in Korean Patent Application Laid-Open No. 2018-0042645 (published on Apr. 26, 2018).

DISCLOSURE

Technical Problem

The present disclosure provides calculation error correction device and method applied to a resistive memory-based neural network accelerator that may increase estimation performance of the neural network accelerator by correcting distortion resulting from matrix multiplication due to wire resistance of a resistive memory.

Technical Solution

The present disclosure provides a calculation error correction device, which is applied to a resistive memory (ReRAM)-based neural network accelerator for performing matrix-vector multiplication, including a first learning unit configured to train an effective weight value prediction model for outputting an effective weight value matrix in which a voltage drop of a resistive memory is reflected by using learning data including a set input vector and the random weight value matrix in response to an input of the random weight value matrix, an effective weight value calculation unit configured to input a first weight value matrix among a first input vector and the first weight value matrix to be calculated into the effective weight value prediction model to derive the effective weight value matrix corresponding thereto, a second learning unit configured to apply a second input vector to a target neural network as an input value, derive an output vector by applying the derived effective weight value matrix to the target neural network as a weight value, train the weight value of the target neural network such that the output vector follows a result of multiplication of the second input vector and the first weight value matrix, and obtain a trained weight value matrix, and a control unit configured to perform matrix-vector multiplication by mapping the first input vector and the trained weight value matrix to the resistive memory.

In addition, the resistive memory may include n bit lines to which n-dimensional input vectors are applied, n×m resistive elements to which an m×n weight value matrix is mapped, and m word lines for deriving m-dimensional output vectors according to the matrix-vector multiplication.

In addition, the first learning unit may train the effective weight value prediction model such that the output effective weight value matrix follows a target weight value matrix estimated in advance from the learning data and information of the resistive memory.

In addition, the target weight value matrix may be previously estimated by applying specification information of the resistive memory, resistance values of constituent members of respective lines, and corresponding learning data to a simulation.

In addition, the effective weight value prediction model may be implemented by a row-column network (RCN) that is trained by combining a layer of a row component and a layer of a column component respectively corresponding to a bit line and a word line of the resistive memory.

In addition, the first learning unit may perform learning such that an effective weight value matrix $W_e$ output from the effective weight value prediction model follows the target weight value matrix $\hat{W}_e$ by using a mean square error calculated by a following equation, $$L = \frac{1}{N}\|\hat{W}_e - W_e\|_2^2$$

where L represents the mean square error and N=n×m.

In addition, the present disclosure provides a calculation error correction method, which uses a calculation error correction device for a resistive memory (ReRAM)-based neural network accelerator that performs matrix-vector multiplication, including training an effective weight value prediction model for outputting an effective weight value matrix in which a voltage drop of a resistive memory is reflected by using learning data including a set input vector and the random weight value matrix in response to an input of the random weight value matrix, inputting a first weight value matrix among a first input vector and the first weight value matrix to be calculated into the effective weight value prediction model to derive the effective weight value matrix corresponding thereto, applying a second input vector to a target neural network as an input value, deriving an output vector by applying the derived effective weight value matrix to the target neural network as a weight value, training the weight value of the target neural network such that the output vector follows a result of multiplication of the second input vector and the first weight value matrix, and obtaining a trained weight value matrix, and performing matrix-vector multiplication by mapping the first input vector and the trained weight value matrix to the resistive memory.

Advantageous Effects

According to the present disclosure, when matrix multiplication of an input vector and a weight value matrix is performed by a resistive memory-based neural network accelerator, distortion resulting from the matrix multiplication due to wire resistance of a resistive memory is corrected, and thus, estimation performance of the resistive memory-based neural network accelerator may be increased.

MODE FOR INVENTION

Figure 1:
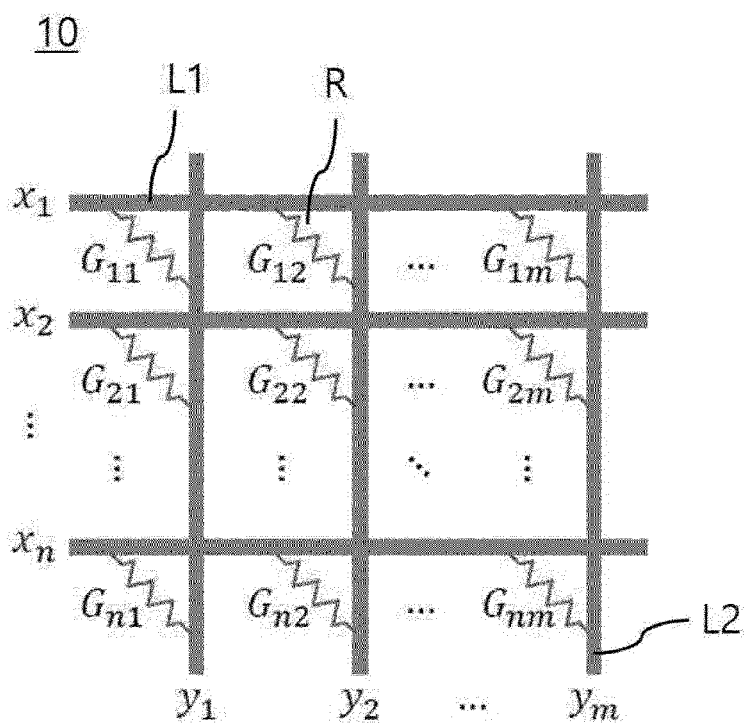
FIG. 1 is a diagram illustrating a hardware structure of a resistive memory-based neural network accelerator applied to an embodiment of the present disclosure.

Embodiments of the present disclosure will be described in detail with reference to the accompanying drawings such that those skilled in the art to which the present disclosure pertains may easily implement the present disclosure. However, the present disclosure may be implemented in several different forms and is not limited to the embodiments described herein. In order to clearly describe the present disclosure in the drawings, parts irrelevant to the description are omitted, and similar reference numerals are attached to similar components throughout the specification.

Throughout the specification, when a portion is "connected" to another portion, this includes not only a case of being "directly connected" but also a case of being "electrically connected" with another element interposed therebetween. In addition, when a portion "includes" a certain component, this means that other components may be further included therein, rather than excluding other components, unless otherwise stated.

FIG. 1 is a diagram illustrating a hardware structure of a resistive memory-based neural network accelerator applied to an embodiment of the present disclosure.

A resistive memory 10 illustrated in FIG. 1 is a ReRAM crossbar array (RCA) of a crossbar array structure and is a passive RCA that performs matrix-vector multiplication (MVM) and operates as neural network accelerator hardware for the MVM.

That is, the resistive memory 10 is used as neural network hardware for MVM, which occupies the most weight in calculation of a neural network. The RCA structure has a great advantage in terms of speed, power, and space during MVM.

As illustrated in FIG. 1, the resistive memory 10 includes n bit lines L1 to which an n-dimensional input vector $[x_1, x_2, \ldots, x_n]^T$ is applied, n×m resistive elements R to which a weight value matrix W of a size m×n is mapped, and m word lines L2 for deriving an m-dimensional output vector $[y_1, y_2, \ldots, y_m]$ according to matrix-vector multiplication.

When an input vector applied to the resistive memory 10 is referred to as X and a weight value matrix is referred to as W and an output vector is referred to as Y, Y=WX is established. Thus, Y represents an MVM output.

In FIG. 1, a value $G_{ij}$ mapped to each resistive element R corresponds to a conductance value that is a reciprocal number of resistance. $i=\{1, \ldots, n\}$, and $j=\{1, \ldots, m\}$.

Matrix-vector multiplication using a hardware structure of the resistive memory 10 described above is performed in the following way.

First, assuming that there is a matrix W and a vector X that are targets of matrix-vector multiplication, multiplication of following Equation 1 may be performed by respectively mapping respective elements $x_1, x_2, \ldots, x_n$ of the vector X to voltage values applied to the n bit lines L1 and by mapping respective elements of the matrix W to conductance values of the respective resistive elements R.

$$W \cdot X = Y \quad \text{Equation 1}$$

Specifically, multiplication of a voltage value and conductance is performed in the same manner as in Equation 2, and an m-dimensional current value $[y_1, y_2, \ldots, y_m]$ is finally output through the m word lines L2 of the resistive memory 10.

$$\begin{bmatrix} G_{11} & G_{21} & \ldots & G_{n1} \\ G_{12} & G_{22} & \ldots & G_{n2} \\ \vdots & \vdots & \ddots & \vdots \\ G_{1m} & G_{2m} & \ldots & G_{nm} \end{bmatrix} \cdot \begin{bmatrix} x_1 \\ x_2 \\ \vdots \\ x_n \end{bmatrix} = [y_1 \ y_2 \ \ldots \ y_m] \quad \text{Equation 2}$$

A relationship between a conductance matrix G according to FIG. 1 and the weight value matrix W of Equation 1 and Equation 2 may be represented as follows.

$$G = \begin{bmatrix} G_{11} & G_{21} & \ldots & G_{1m} \\ G_{12} & G_{22} & \ldots & G_{2m} \\ \vdots & \vdots & \ddots & \vdots \\ G_{n1} & G_{n2} & \ldots & G_{nm} \end{bmatrix} = W^T \quad \text{Equation 3}$$

As such, the resistive memory 10 performs MVM of the n-dimensional input vector X input to the n bit lines L1 and the weight value matrix W determined by conductance values of the respective resistive elements R, thereby outputting an m-dimensional output vector Y through the m word lines L2.

However, an IR drop (a voltage drop) exists in the resistive memory 10 due to wire resistance caused by a hardware structure, and this generates a smaller output value Y' than an actual expected multiplication result (a true value; Y).

The IR drop due to the wire resistance causes an error (distortion) resulting from matrix-vector multiplication, and the calculation error is a factor that degrades analysis and estimation performed through a neural network.

Moreover, influence of a voltage drop does not appear in the same size in all n×m resistive elements R, and in particular, appears larger in elements farther from input and output ports, and is also affected by a size of the wire resistance and resistance values of peripheral elements. In addition, a simulation program with integrated circuit emphasis (SPICE) simulation method may accurately simulate the influence of voltage drop but has a disadvantage in that the SPICE simulation method takes a lot of time, and thus, it is almost impossible to apply the SPICE simulation method to actual calculation of a neural network that requires real-time fast calculation. Therefore, a fast and accurate new model that may predict influence of a voltage drop is required.

Figure 2:
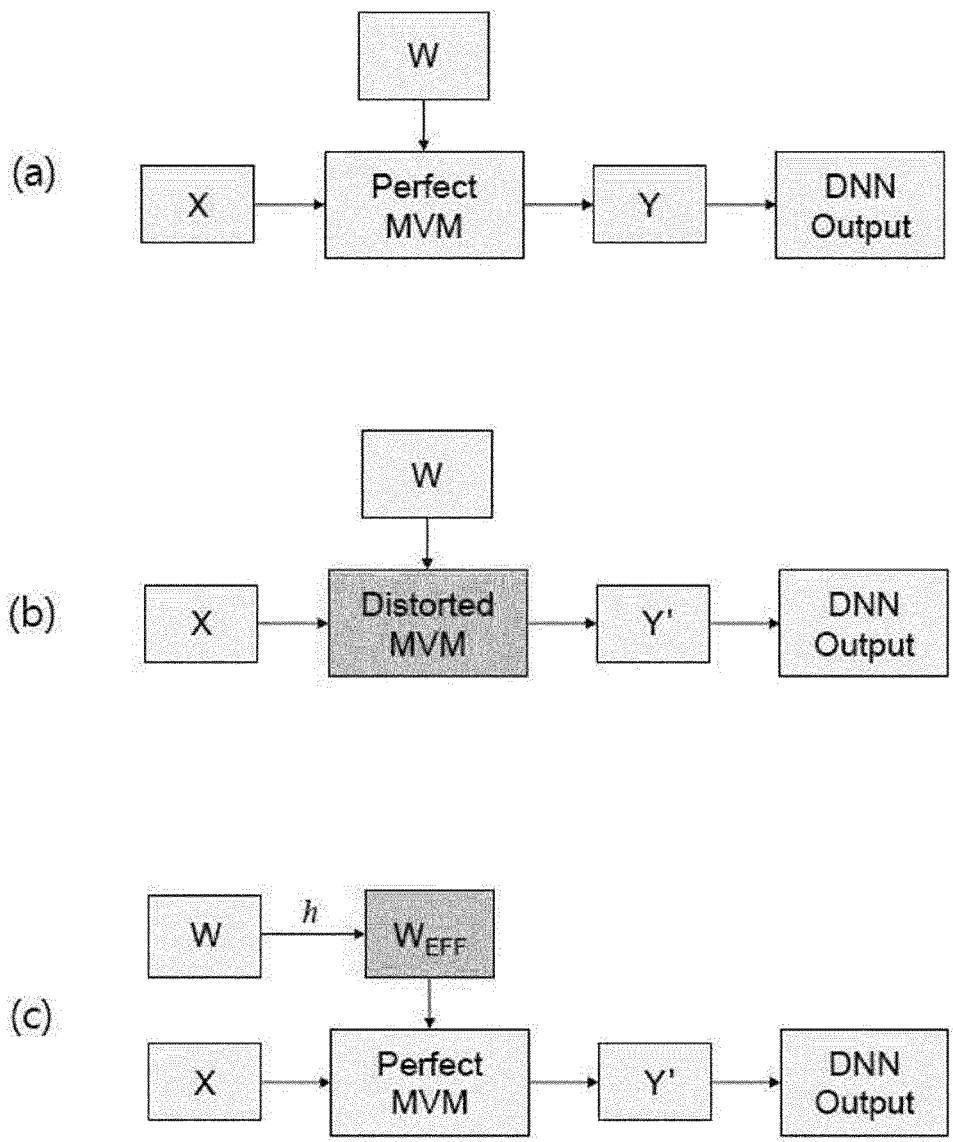
FIG. 2 is a diagram illustrating concept of compensating for distortion resulting from matrix-vector multiplication (MVM) using an effective weight value in the embodiment of the present disclosure.

FIG. 2 is a diagram illustrating concept of compensating for distortion resulting from MVM using an effective weight value in the embodiment of the present disclosure.

(a) of FIG. 2 illustrates an ideal case in which MVM distortion does not exist in the resistive memory 10. In this case, an actual expected true value Y is derived from a result of multiplication of the input vector X and the weight value matrix W.

However, (b) of FIG. 2 illustrates a situation in which the MVM distortion exists due to wire resistance. In this case, it may be seen that as a result of multiplication of the vector X and the matrix W, a distorted result Y' smaller than the true value Y is derived due to influence of a voltage drop. As such, when the MVM distortion exists in the resistive memory 10, estimation performance of a neural network (DNN) is reduced.

A result of (b) of FIG. 2 may be summarized as Y'=g(W, X)≠WX. A function g that derives the distorted calculation result Y' may be estimated through a simulation such as SPICE, but in a case of the SPICE simulation, a considerable time is required to obtain a result value.

In the embodiment of the present disclosure, an effective weight value $W_{EFF}$ (hereinafter, referred to as $W_e$) is predicted from the weight value W to be calculated, by using a separate prediction model h(W)=$W_e$ illustrated in (c) of FIG. 2 instead of a method of obtaining the function g.

At this time, the effective weight value $W_e$ is not an original W value and is an effective value affected by voltage drop according to the wire resistance of the resistive memory 10, and the distorted calculation result is represented multiplication of an effective weight value and an input, that is, Y'=$W_e$·X. An embodiment of the present disclosure trains a target neural network according to an actual distorted calculation result as described above.

To this end, first, an effective weight value prediction model is built, and based on this, the effective weight value matrix $W_e$ in which the distorted MVM reflected is derived from the original weight value matrix W, and then retraining is performed by applying the derived effective weight value matrix $W_e$ to training of the target neural network that performs matrix-vector multiplication.

In a retraining process, a trained weight value matrix W' is newly obtained by performing training to readjust a weight value such that, in the target neural network, a result (Y'=$W_e$X) of the matrix-vector multiplication of the effective weight value matrix $W_e$ and a random input vector X follows a target value (Y=WX) to be actually derived. When the newly obtained weight value matrix W' is applied as each conductance value of resistive elements of the resistive memory 10 instead of the weight value matrix W to be used originally, an accurate output value Y (W'·X=Y) obtained by offsetting influence of a voltage drop may be obtained.

As described above, in the embodiment of the present disclosure, assuming that there are a vector X and a matrix W that are targets of the matrix-vector multiplication, the effective weight value matrix $W_e$ in which voltage drop due to wire resistance of the corresponding resistive memory 10 is reflected is first predicted based on a pre-trained prediction model. In addition, the adjusted (trained) weight value matrix W' is obtained by re-training the effective weight value matrix $W_e$ for a target neural network and is updated to be used instead of the original weight value matrix W during the matrix-vector multiplication of the actual resistive memory 10.

The distortion-corrected true value Y or a high-accuracy estimation result close thereto may be derived by using the updated weight value matrix as a conductance value of each element in the resistive memory 10. In this way, a problem of estimation performance reduction of a neural network caused by wire resistance may be effectively solved.

That is, according to the present disclosure, the estimation performance of a corresponding neural network may be increased by reducing a calculation error of a neural network accelerator implemented by hardware of the actual resistive memory 10. When the corresponding neural network (DNN) is an algorithm for classifying (for example, classifying people, cars, and so on) objects in an image, and when the embodiment of the present disclosure is applied, performance and accuracy of object classification may be increased by reducing a matrix-vector multiplication error.

Next, a configuration of a calculation error correction device applied to a resistive memory-based neural network accelerator according to an embodiment of the present disclosure will be described in more detail.

Figure 3:
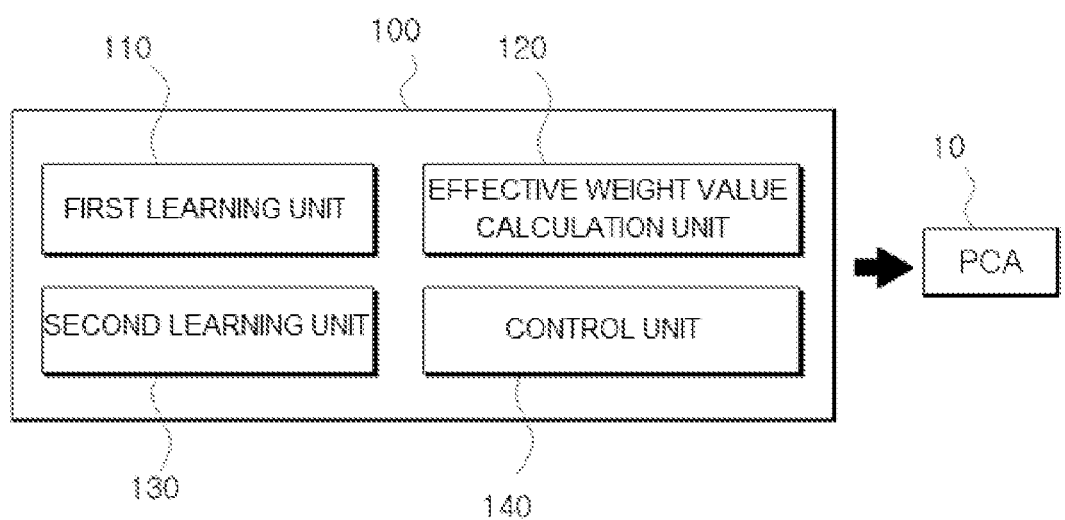
FIG. 3 is a diagram illustrating a configuration of a calculation error correction device applied to the resistive memory-based neural network accelerator illustrated in FIG. 1.

FIG. 3 is a diagram illustrating a configuration of a calculation error correction device applied to the resistive memory-based neural network accelerator illustrated in FIG. 1.

As illustrated in FIG. 3, a calculation error correction device 100 for a resistive memory-based neural network accelerator includes a first learning unit 110, an effective weight value calculation unit 120, a second learning unit 130, and a control unit 140.

The first learning unit 110 trains an effective weight value prediction model for outputting an effective weight value matrix in which a voltage drop of a resistive memory is reflected by using learning data including a set input vector and the random weight value matrix in response to an input of the random weight value matrix.

For example, the input vector and the random weight value matrix may be composed of a combination of binary data of 1 or 0, and the random weight value matrix may be randomly generated by using a separate generator.

In the embodiment of the present disclosure, multiple learning data sets are configured and used for learning in order to increase reliability of a prediction model.

For this purpose, the first learning unit 110 also collects a target weight value matrix $\hat{W}_e$ which is previously estimated from corresponding learning data and information of the resistive memory 10 and configures a set of the target weight value matrix and the corresponding learning data.

The target weight value matrix may be estimated in advance through an existing SPICE simulation. Specification information (a geometric structure, a size, a property, and so on) of a resistive memory, corresponding learning data, and so on may be utilized as parameter values for a simulation. Here, a resistance value (wire resistance) of a metal material constituting each line may also be included in the specification information. Accordingly, the target weight value matrix $\hat{W}_e$ corresponds to the same concept as an effective weight value matrix in which influence of a voltage drop is reflected in the resistive memory 10 and corresponds to a value obtained by a simulation.

In order to know an exact effective weight value, a SPICE simulation needs to be used but is too slow to be used in a training process. Instead, in the embodiment of the present disclosure, the SPICE simulation is used only when generating data (a target weight value matrix) required for training a model for predicting the effective weight value $W_e$ from the given weight W and when finally verifying estimation performance. This is because, while learning requires thousands of simulations, no more than hundreds of simulations are required for verification within a sufficient time range.

The first learning unit 110 configures an effective weight value prediction model using a random weight value matrix as an input variable and using an effective weight value matrix corresponding thereto as an output and trains the prediction model based on the effective weight value prediction model.

Here, the first learning unit 110 trains the effective weight value prediction model such that an effective weight value matrix output from the effective weight value prediction model follows a target weight value matrix.

Here, influence of matrix multiplication distortion exists in both a horizontal (input) direction and a vertical (output) direction in the resistive memory 10, and thus, the embodiment of the present disclosure uses a model for predicting separately influences of the two directions.

Specifically, the effective weight value prediction model according to the embodiment of the present disclosure may be implemented by a row-column network (RCN) for learning by combining a layer of a row component and a layer of a column component respectively corresponding to a bit line and a word line of the resistive memory 10.

The RCN is a non-linear model and is configured by stacking a plurality of neural network layers. A voltage drop (an IR drop) exists in both a row direction and a column direction, and thus, it is preferable to combine row and column direction models. Therefore, RCN may be configured by first defining the layers in the row direction and the column direction individually and then combining the layers. A specific example thereof is as follows.

A model $PL_{row}$ for predicting a horizontal influence may be represented by Equation 4, and a given matrix is processed in parallel as an independent linear regression model for each row. Accordingly, it is possible to form a parallel linear layer that is a form in which general linear layers are connected in parallel.

$$PL_{row}: X \to Y \text{ where } Y^{[i]} = f(X^{[i]} \cdot R_i + \vec{b}_i) \quad \text{Equation 4}$$

Here, $X^{[i]}$ is an i-th row component for a set input vector, $f(\cdot)$ is a nonlinear activation function (for example, tanh), $R_i$ is a weight element matrix of a size m×m, and $\vec{b}_i$ is an m-dimensional bias vector. Through this, an input vector and an output vector may be divided for each row, and each row has unique linear regression parameter according to the nonlinear activation function.

Next, in order to predict influence in the vertical direction, an independent parallel linear layer ($PL_{col}(X)$) is applied to each column. Structures thereof are similar to each other except that columns rather than rows are processed in parallel.

$$PL_{col}(X) = PL_{row}(X^T)^T \quad \text{Equation 5}$$

In addition, a prediction model (RCN) of Equation 6 having dependencies in both the row direction and the column direction may be defined by stacking parallel linear layers in two directions.

$$RCN: W_e = PL_{col}(PL_{row}(W)) \circ U \quad \text{Equation 6}$$

Here, U is a parameter matrix of a size of n×m for an element-wise multiplication layer that allows a size of $W_e$ to fall within a range of [−1, 1], and ◯ is a Hadamard product. W is a weight value matrix randomly generated as learning data, and $W_e$ is an effective weight value matrix that is an output value for a prediction model.

When the two layers according to Equation 4 and Equation 5 are sequentially connected to each other and a range of an output value is adjusted to [−1, 1] by adding an element-wise multiplication layer to the end, the prediction model (RCN) represented in Equation 5 may be completed.

According to this, the effective weight value prediction model (RCN) may be trained by taking a randomly generated weight value matrix having binary values 0 or 1 as an input and targeting a matrix corresponding to the effective weight value estimated through a SPICE simulation.

In addition, it may be seen that the effective weight value prediction model (RCN) is configured to output the effective weight value matrix $W_e$ in response to the input weight value matrix W.

Here, the first learning unit 110 may train such that the effective weight value matrix $W_e$ output from the effective weight value prediction model follows the target weight value matrix $\hat{W}_e$ by using a mean square error L calculated by following Equation 7.

$$L = \frac{1}{N} \|\hat{W}_e - W_e\|_2^2 \quad \text{Equation 7}$$

Here, L corresponds to a mean square error (MSE), and N=n×m. That is, according to Equation 7, learning may be performed such that the mean square error between $W_e$ and $\hat{W}_e$ is minimized, and for example, when the mean square error falls within a preset reference value, the learning may be completed.

Here, a target weight value matrix corresponds to a value previously estimated by a SPICE simulation as described above.

After learning is completed in this way, the effective weight value prediction model may output and provide an effective weight value matrix corresponding to an input of the corresponding weight value matrix when there are an input vector and a weight value matrix that are targets of matrix-vector multiplication.

If the input vector and the weight value matrix that are targets of matrix-vector multiplication are a first input vector and a first weight value matrix, the effective weight value prediction model may accurately output and provide an effective weight value matrix in which influence of a voltage drop is reflected in response to an input of the first weight value matrix.

Here, in the embodiment of the present disclosure, when training of the effective weight value prediction model is completed, retraining may be performed by applying the effective weight value prediction model to training of an original target neural network. By replacing a matrix multiplication part (Y=WX) of a neural network in the retraining process with a matrix multiplication (Y=h(W)X) considering an effective weight value, a degree of distortion may be compensated in the training process. In addition, accuracy of the trained network may be verified through a SPICE simulation again.

Meanwhile, although the embodiment of the present disclosure uses an RCN-based learning model as a representative example, a scaling convolutional network (SCN)-based learning model may also be used.

An SCN model predicts an effective weight value based on influence of surrounding elements. In order to simplify a process of designing a network, spatial correlation is obtained and a convolution layer is added to compensate for an error for each memory cell. The convolution layer is good at adjusting a spatial pattern of an input with a small number of parameters. At a higher level, an SCN consists of two-way scaling layers and a convolutional network therebetween. An inner convolutional network is defined as a stack of n basic blocks and includes c output channels except for the last layer. The last layer includes one output channel.

A basic block $CL_c$ is represented by following Equation 8.

$$CL_c: X \to Y \text{ where } Y=\text{ReLU}(\text{Conv}_c(X)) \qquad \text{Equation 8}$$

That is, a size of a convolutional filter is 3×3, padding and stride are 1, and a convolution layer including c output channels and a ReLU activation function are used as the basic block $CL_c$.

In addition, when n blocks are connected to each other and element-wise multiplication layer U1 and U2 are respectively added to an input and an output, the SCN model represented by Equation 9 is constructed.

$$SCN_{n,c}: W_e = CL_1(CL_c( \ldots (CL_c(W \circ U_1))))\circ U_2 \qquad \text{Equation 9}$$

At this time, the element-wise multiplication layer reflects influence of an absolute position (distance from an input/output port) of a device, the convolution layer reflects influence of a relative position (a resistance value of a surrounding device) of the device, and thus, a final effective weight value $W_e$ is predicted.

Hereinafter, use of an RCN model will be described as a representative example.

After learning of the effective weight value prediction model is completed, the effective weight value calculation unit 120 inputs a first weight value matrix among the first input vector and the first weight value matrix to be calculated into the pre-trained effective weight value prediction model to derive an effective weight value matrix corresponding thereto. That is, the effective weight value prediction model (RCN) may output an effective weight value matrix in response to an input of a weight value matrix that is a target of MVM.

Thereafter, the second learning unit 130 applies the derived effective weight value matrix to a target neural network to retrain and derives a trained weight value matrix. The trained weight value matrix refers to a weight value matrix of which distortion is adjusted by training a neural network from the effective weight value matrix.

The target neural network may be obtained by implementing the resistive memory 10 as it is and may operate to perform matrix-vector multiplication and may be implemented in software. In the embodiment of the present disclosure, the target neural network uses a binarized neural network (BinaryNet).

The second learning unit 130 applies a second input vector as an input value to the target neural network, and trains a weight value of the target neural network such that an output vector derived when an effective weight value matrix corresponding to the first weight value matrix is applied as a weight value follows a correct answer value (a result of multiplication of the second input vector and the first weight value matrix), thereby obtaining the trained weight value matrix W'. The target neural network initially outputs a distorted result that is multiplication of an input vector and an effective weight value like the resistive memory 10, and outputs a value close to a correct answer as learning proceeds. Through this, distortion is corrected during the training process.

Here, the second input vector is learning data used for learning of the target neural network, which is different from the first input vector used for actual estimation. In this way, when the first input vector used for actual estimation and the second input vector used for learning the target neural network are differently applied, estimation performance robust to various input patterns is obtained.

The control unit 140 performs matrix-vector multiplication by mapping the first input vector and the trained weight value matrix W to the resistive memory 10 instead of the first input vector and the first weight value matrix W, which are targets of matrix multiplication. That is, the control unit 140 applies the first input vector to a bit line of the resistive memory 10 and applies the trained weight value matrix to a conductance value of a resistive element in the resistive memory 10.

Accordingly, the resistive memory 10 derives a result of multiplying the first input vector by the trained weight value matrix as an output value and provides the derived result. The trained weight value solves a problem of output distortion caused by an IR drop (a voltage drop). When the weight value matrix W' newly obtained by training is applied to each conductance value of each resistive element in the resistive memory 10 instead of the weight value matrix W to be originally used, a correct output value Y in which influence of a voltage drop is offset, or a value close thereto may be obtained.

As described above, according to the present disclosure, a new weight value matrix that may correct distortion is derived by predicting an effective weight value matrix in which distortion of a voltage drop due to wire resistance of the resistive memory when a resistive memory-based neural network accelerator performs matrix multiplication of an input vector and a weight value matrix and by applying the predicted effective weight value matrix to the target neural network and by retraining the target neural network. Through this, estimation performance for the resistive memory-based neural network accelerator may be increased.

Figure 4:
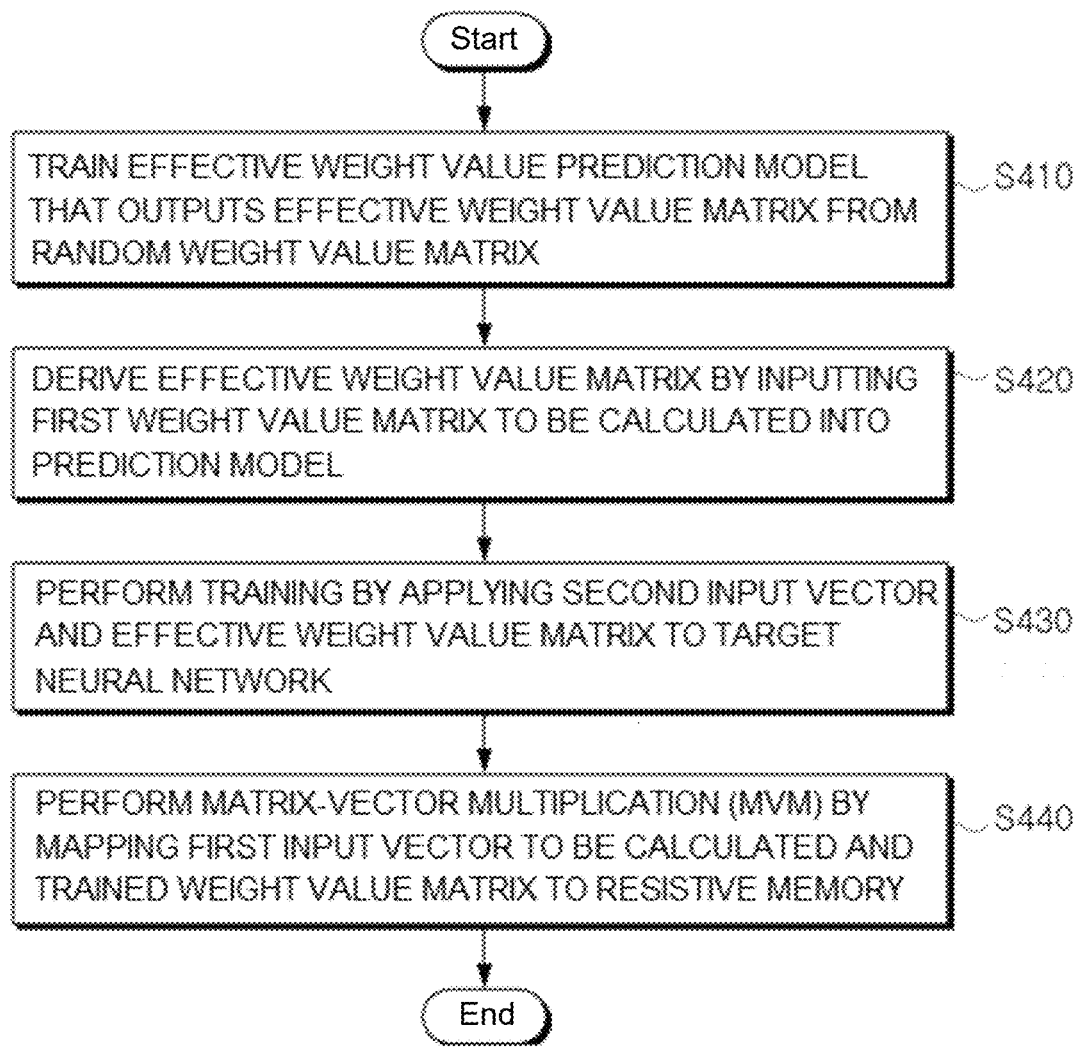
FIG. 4 is a flowchart illustrating a calculation error correction method using FIG. 2.

FIG. 4 is a flowchart illustrating a method of correcting a calculation error with reference to FIG. 2.

First, the first learning unit 110 trains an effective weight value prediction model that outputs an effective weight value matrix in response to an input of a random weight value matrix by using learning data and a target weight value matrix corresponding thereto (S410).

Specifically, the first learning unit 110 configures an effective weight value prediction model that uses a random weight value matrix as an input value and uses an effective weight value matrix corresponding thereto as an output value and trains a prediction model. At this time, the prediction model is trained such that the effective weight value matrix, which is an output value of the effective weight value prediction model, follows a target weight value matrix matched to corresponding learning data.

After the learning is completed, the effective weight value calculation unit 120 inputs a first weight value matrix among a first input vector and the first weight value matrix to be calculated into the effective weight value prediction model to obtain an effective weight value matrix from the corresponding prediction model (S420).

The effective weight value prediction model pre-trained in step S410 provides the effective weight value matrix in a state in which a voltage drop of a resistive memory is reflected in the first weight value matrix, as an output value.

Thereafter, the second learning unit 130 performs training by applying a second input vector and the effective weight value matrix obtained in step S420 to a target neural network (S430). As a weight value is adjusted accordingly, a new weight value matrix according to the training is obtained. S430 to S440 may be repeated for every update of a weight value in the training process.

Thereafter, the control unit 140 performs MVM by mapping the first input vector and the trained new weight value matrix to the resistive memory 10 (S440). For example, the control unit 140 may control a signal applied to the resistive memory 10, and through this, the first input vector may be mapped to the bit line L1 of the resistive memory 10, and the trained weight value matrix may be mapped to the resistive element R.

Accordingly, the resistive memory 10 may derive an output vector in which calculation distortion due to wire resistance is corrected by multiplying the first input vector by the trained weight value matrix. According to this, it is also possible to solve a problem of calculation distortion that occurs when the first weight value matrix is used as it is.

Figure 5:
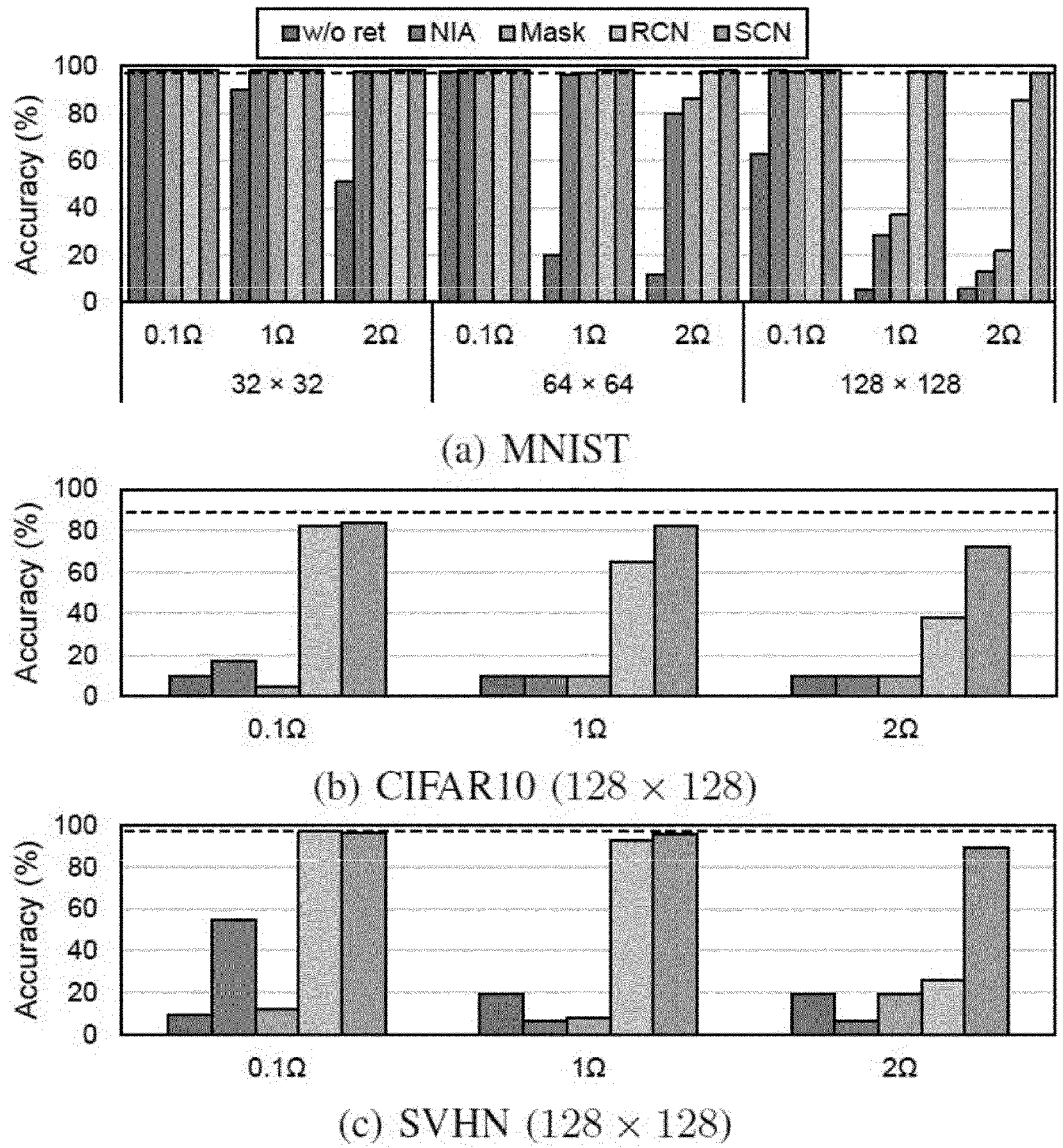
FIG. 5 illustrates results of verifying, through a simulation, accuracy of a prediction model according to an embodiment of the present disclosure.

FIG. 5 illustrates results of verifying, through a simulation, accuracy of a prediction model according to an embodiment of the present disclosure.

FIG. 5 illustrates results of validation accuracy verified through a SPICE simulation. At this time, performance test was performed on resistive memory crossbar arrays (RCAs) of various sizes (32×32 and 64×64).

At this time, a target neural network is a BinaryNet, and a datasets used in the network include Modified National Institute of Standards and Technology database (MNIST), Canadian Institute for Advanced Research 10 (CIFAR10), and Street View House Numbers (SVHN).

In FIG. 5, w/o ret is a case in which separate distortion correction is not performed, a mask technique and a NIA technique are known effective weight value prediction techniques, and an RCN and an SCN correspond to an effective weight value prediction technique according to the present disclosure. It may be seen from the results of FIG. 5 that, when RCN and SCN prediction models are used, superior accuracy is achieved compared to the known mask method and NIA method. Dotted lines in graphs indicate ideal baseline accuracy when there is no wire resistance, and the RCN and SCN show very good performance even under high wire resistance.

According to the present disclosure described above, when matrix multiplication of an input vector and a weight value matrix is performed by a resistive memory-based neural network accelerator, distortion resulting from matrix multiplication due to wire resistance of a resistive memory is corrected, and thus, estimation performance of the resistive memory-based neural network accelerator may be increased.

Although the present disclosure is described with reference to the embodiments illustrated in the drawings, the embodiments are merely examples, and those skilled in the art will understand that various modifications and equivalent other embodiments may be made therefrom. Accordingly, the true technical protection scope of the present disclosure should be determined by the technical idea of the appended claims.

The invention claimed is:

1. A calculation error correction device applied to a resistive memory (ReRAM)-based neural network accelerator for performing matrix-vector multiplication, the calculation error correction device comprising:
a processor configured to implement:
a first learning unit configured to train an effective weight value prediction model for outputting an effective weight value matrix in which a voltage drop of a resistive memory is reflected by using learning data including a set input vector and a random weight value matrix,
wherein the learning data includes a target weight value matrix corresponding to the random weight value matrix, the target weight value matrix being previously estimated by simulating the resistive memory based on specification information of the resistive memory including wire resistance values of interconnect lines,
wherein the first learning unit trains the effective weight value prediction model such that an effective weight value matrix output from the effective weight value prediction model follows the target weight value matrix;
an effective weight value calculation unit configured to input a first weight value matrix into the effective weight value prediction model to derive the effective weight value matrix corresponding thereto;
a second learning unit configured to apply a second input vector to a target neural network as an input value, derive an output vector by applying the derived effective weight value matrix to the target neural network as a weight value, train the weight value of the target neural network such that the output vector matches a result of multiplication of the second input vector and the first weight value matrix, and obtain a trained weight value matrix; and
a control unit configured to perform matrix-vector multiplication by mapping a first input vector and the trained weight value matrix to the resistive memory,
wherein the resistive memory includes n bit lines to which n-dimensional input vectors are applied, n×m resistive elements to which an m×n weight value matrix is mapped, and m word lines for deriving m-dimensional output vectors according to the matrix-vector multiplication.

2. The calculation error correction device of claim 1, wherein
the effective weight value prediction model is implemented by a row-column network (RCN) that is trained by combining a layer of a row component and a layer of a column component respectively corresponding to a bit line and a word line of the resistive memory.

3. The calculation error correction device of claim 1, wherein
the first learning unit performs learning by using a mean square error calculated by a following equation, $$L = \frac{1}{N}\|\hat{W}_e - W_e\|_2^2$$

where L represents the mean square error and N=n×m.

4. A calculation error correction method for a resistive memory (ReRAM)-based neural network accelerator that performs matrix-vector multiplication, the calculation error correction method comprising:

training an effective weight value prediction model for outputting an effective weight value matrix in which a voltage drop of a resistive memory is reflected by using learning data including a set input vector and a random weight value matrix, wherein the training comprises providing the learning data including a random weight value matrix and a corresponding target weight value matrix that is previously estimated by simulating the resistive memory based on specification information of the resistive memory including wire resistance values of interconnect lines, and updating parameters of the effective weight value prediction model such that an output effective weight value matrix the effective weight value prediction model follows the target weight value matrix;

inputting a first weight value matrix into the effective weight value prediction model to derive the effective weight value matrix corresponding thereto;

applying a second input vector to a target neural network as an input value, deriving an output vector by applying the first derived effective weight value matrix to the target neural network as a weight value, training the weight value of the target neural network such that the output vector matches a result of multiplication of the second input vector and the first weight value matrix, and obtaining a trained weight value matrix; and performing matrix-vector multiplication by mapping a first input vector and the trained weight value matrix to the resistive memory, wherein the resistive memory includes n bit lines to which n-dimensional input vectors are applied, n×m resistive elements to which an m×n weight value matrix is mapped, and m word lines for deriving m-dimensional output vectors according to the matrix-vector multiplication.

5. The calculation error correction method of claim 4, wherein the effective weight value prediction model is implemented by a row-column network (RCN) that is trained by combining a layer of a row component and a layer of a column component respectively corresponding to a bit line and a word line of the resistive memory.

6. The calculation error correction method of claim 4, wherein, in the training of an effective weight value prediction model, learning is performed by using a mean square error calculated by a following equation, $$L = \frac{1}{N}\|\hat{W}_e - W_e\|_2^2$$

where L represents the mean square error and N=n×m.

* * * * *